(12) United States Patent
Rhodes

(10) Patent No.: US 6,376,868 B1
(45) Date of Patent: Apr. 23, 2002

(54) MULTI-LAYERED GATE FOR A CMOS IMAGER

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/333,011

(22) Filed: Jun. 15, 1999

(51) Int. Cl.[7] .................. H01L 29/76; H01L 27/148; H01L 29/768
(52) U.S. Cl. .................. 257/215; 257/214; 257/216; 257/232; 257/233
(58) Field of Search ................ 257/232, 233, 257/214, 215, 216

(56) References Cited

U.S. PATENT DOCUMENTS

| | | |
|---|---|---|
| 4,262,297 A | 4/1981 | Partridge |
| 4,309,624 A | 1/1982 | Hynecek et al. |
| 4,319,261 A | 3/1982 | Kub |
| 4,374,700 A | 2/1983 | Scott et al. |
| 4,700,459 A | 10/1987 | Peek |
| 5,151,385 A * | 9/1992 | Yamamoto et al. ......... 437/181 |
| 5,319,604 A | 6/1994 | Imondi et al. |
| 5,393,997 A | 2/1995 | Fukusho et al. |
| 5,461,425 A | 10/1995 | Fowler et al. |
| 5,471,515 A | 11/1995 | Fossum et al. |
| 5,506,429 A | 4/1996 | Tanaka et al. |
| 5,541,402 A | 7/1996 | Ackland et al. |
| 5,576,763 A | 11/1996 | Ackland et al. |
| 5,608,243 A | 3/1997 | Chi et al. |
| 5,612,799 A | 3/1997 | Yamazaki et al. |
| 5,614,744 A | 3/1997 | Merrill |
| 5,625,210 A | 4/1997 | Lee et al. |
| 5,705,846 A | 1/1998 | Merrill |
| 5,708,263 A | 1/1998 | Wong |
| 5,747,840 A | 5/1998 | Merrill |
| 5,757,045 A | 5/1998 | Tsai et al. |
| 5,760,458 A | 6/1998 | Bergemont et al. |
| 5,798,542 A * | 8/1998 | Anagnostopoulos et al. ..... 257/232 |
| 5,889,277 A * | 3/1999 | Hawkins et al. ......... 250/208.1 |
| 5,895,944 A * | 4/1999 | Yamada ...................... 257/233 |

OTHER PUBLICATIONS

Dickinson, A., et al., A 256×256 CMOS Active Pixel Image Sensor with Motion Detection, 1995 IEEE International Solid–State Circuits Conference, pp. 226–227.

Dickinson, A., et al., Standard CMOS Active Pixel Image Sensors for Multimedia Applications, Proceedings of Sixteenth Conference on Advanced Research in VLSI, Mar. 27–29, 1995, pp. 214–224.

Eid, E–S., et al., A 256×256 CMOS Active Pixel Image Sensor, Proc. SPIE vol. 2415, Apr. 1995, pp. 265–275.

Fossum, E., CMOS Image Sensors: Electronic Camera On A Chip, 1995 IEEE, pp. 17–25.

(List continued on next page.)

Primary Examiner—Eddie Lee
Assistant Examiner—Jesse A. Fenty
(74) Attorney, Agent, or Firm—Dickstein Shapiro Morin & Oshinsky LLP

(57) ABSTRACT

A multi-layered gate for use in a CMOS or CCD imager formed with a second gate at least partially overlapping it. The multi-layered gate is a complete gate stack having an insulating layer, a conductive layer, an optional silicide layer, and a second insulating layer, and has a second gate formed adjacent to it which has a second conductive layer that extends at least partially over the surface of the multi-layered gate. The multi-layered gate has improved insulation, thereby resulting in fewer shorts between the conductive layers of the two gates. Also disclosed are processes for forming the multi-layered gate and the overlapping gate.

66 Claims, 11 Drawing Sheets

OTHER PUBLICATIONS

Fossum, E., et al., IEDM A 37×28mm$^2$600k–Pixel CMOS APS Dental X–Ray Camera–on–a–Chip with Self–Triggered Readout, 1998 IEEE International Solid–State Circuits Conference, pp. 172–173.

Fossum, E., Low Power Camera–on–a–Chip Using CMOS Active Pixel Sensor Technology, 1995 IEEE, pp. 74–77.

Fossum, E., Architectures for focal plane image processing, Optical Engineering, vol. 28, No. 8, Aug. 1989, pp. 865–871.

Janesick, J., et al., New advancements in charge–coupled device technology—sub–electron noise and 4096×4096 pixel CCDs, Proc. SPIE vol. 1242, 1990, pp. 223–237.

Kemeny, S.E., et al., Update on focal–plane image processing research, Proc. SPIE vol. 1447, 1991, pp. 243–250.

Mendis, S., et al., CMOS Active Pixel Image Sensor, IEEE Transactions on Electron Devices, vol. 41, No. 3, Mar. 1994, pp. 452–453.

Mendis, S.K., et al., A 128×128 CMOS Active Pixel Image Sensor for Highly Integrated Imaging Systems, 1993 IEEE, pp. 583–586.

Mendis, S.K., et al., CMOS Active Pixel Image Sensors for Highly Integrated Imaging Systems, IEEE Journal of Solid–State Circuits, vol. 32, No. 2, Feb. 1997, pp. 187–197.

Mendis, S.K., et al., Design of a Low–Light–Level Image Sensor with On–Chip Sigma–Delta Analog–to–Digital Conversion, Proc. SPIE vol. 1900, Jul. 1993, pp. 31–39.

Mendis, S.K., et al., Low–Light–Level Image Snesor with On–Chip Signal Processing, Proc. SPIE vol. 1952, Nov. 1993, pp. 23–33.

Mendis, S.K., et al., Progress In CMOS Active Pixel Image Sensors, Proc. SPIE vol. 2172, May 1994, pp. 19–29.

Nakamura, J., et al., CMOS Active Pixel Image Sensor with Simple Floating Gate Pixels, IEEE Transactions on Electron Devices, vol. 42, No. 9, Sep. 1995, pp. 1693–1694.

Nixon, R.H., et al., 256×256 CMOS Active Pixel Sensor Camera–on–a–Chip, IEEE Journal of Solid–State Circuits, vol. 31, No. 12, Dec. 1996, pp. 2046–2050.

Nixon, R.H., et al., 256×256 CMOS Active Pixel Sensor Camera–on–a–Chip, 1996 IEEE International Solid–State Circuits Conference, pp. 178–179.

Panicacci, R., et al., Programmable multiresolution CMOS active pixel sensor, Proc. SPIE vol. 2654, Mar. 1996, pp. 72–79.

Panicacci, R.A., et al., 128Mb/s Multiport CMOS Binary Active–Pixel Image Sensor, 1996 IEEE International Solid–State Circuit Conference, pp. 100–101.

Yadid–Pecht, O., et al., CMOS Active Pixel Sensor Star Tracker with Regional Electronic Shutter, IEEE Journal of Solid–State Circuits, vol. 32, No. 2, Feb. 1997, pp. 285–288.

Yadid–Pecht, O., et al., Wide dynamic range APS star tracker, Proc. SPIE vol. 2654, Mar. 1996, pp. 82–92.

Zarnowski, J., et al., Imaging options expand with CMOS technology, Laser Focus World, Jun. 1997, pp. 125–130.

Zhou, Z., et al., A Cmos Imager with On–Chip Variable Resolution for Light–Adaptive Imaging, 1998 IEEE International Solid–State Circuits Conference, pp. 174–175.

Zhou Z., et al., A Digital CMOS Active Pixel Image Sensor For Multimedia Applications, Proc. SPIE vol. 2894, Sep. 1996, pp. 282–288.

* cited by examiner

MULTI-LAYERED GATE FOR A CMOS IMAGER

FIELD OF THE INVENTION

The present invention relates generally to improved semiconductor imaging devices and in particular to a silicon imaging device having a multilayered gate and a second gate which overlaps the multi-layered gate, and that can be fabricated using a standard CMOS process.

BACKGROUND OF THE INVENTION

There are a number of different types of semiconductor-based imagers, including charge coupled devices (CCDs), photodiode arrays, charge injection devices and hybrid focal plane arrays. CCD technology is often employed for image acquisition and enjoys a number of advantages which makes it the incumbent technology, particularly for small size imaging applications. CCDs are capable of large formats with small pixel size and they employ low noise charge domain processing techniques.

However, CCD imagers also suffer from a number of disadvantages. For example, they are susceptible to radiation damage, they exhibit destructive read-out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there have been some attempts to integrate on-chip signal processing with CCD arrays, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel which results in image smear.

Because of the inherent limitations in CCD technology, there is an interest in CMOS imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD because standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate, photoconductor or a photodiode overlying a substrate for accumulating photo-generated charge in the underlying portion of the substrate. A readout circuit is corrected to each pixel cell and includes at least an output field effect transistor formed in the substrate and a charge transfer section formed on the substrate adjacent the photogate, photoconductor or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate or photoconductor. For photodiodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046–2050 (1996); Mendis et al., "CMOS Active Pixel Image Sensors," IEEE Transactions on Electron Devices, Vol. 41(3), pp. 452–453 (1994), as well as U.S. Pat. Nos. 5,708,263 and 5,471,515, which are herein incorporated by reference.

To provide context for the invention, an exemplary CMOS imaging circuit is described below with reference to FIG. 1. The circuit described below, for example, includes a photogate for accumulating photo-generated charge in an underlying portion of the substrate. It should be understood that the CMOS imager may include a photodiode or other image to charge converting device, in lieu of a photogate, as the initial accumulator for photo-generated charge.

Reference is now made to FIG. 1 which shows a simplified circuit for a pixel of an exemplary CMOS imager using a photogate and having a pixel photodetector circuit 14 and a readout circuit 60. It should be understood that while FIG. 1 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 typically a p-type silicon, having a surface well of p-type material 20. An optional layer 18 of p-type material may be used if desired, but is not required. Substrate 16 may be formed of; for example, Si, SiGe, Ge, or GC. Typically the entire substrate 16 is p-type doped silicon substrate and may contain a surface p-well 20 (with layer 18 omitted), but many other options are possible, such as, for example p on p− substrates, p on p+ substrates, p-wells in n-type substrates or the like. The terms wafer or substrate used in the description includes any semiconductor-based structure having an exposed surface in which to form the circuit structure used in the invention. Wafer and substrate are to be understood as including silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-well 20. The p-type layer may be a p-well formed in substrate 16. A photogate 24 thin enough to pass radiant energy or of a material which passes radiant energy is formed on the insulating layer 22. The photogate 24 receives an applied control signal PG which causes the initial accumulation of pixel charges in n+ region 26. The n+ type region 26, adjacent one side of photogate 24, is formed in the upper surface of p-well 20. A transfer gate 28 is formed on insulating layer 22 between n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. It is also a node for passing charge accumulated thereat to the gate of a source follower transistor 36 described below.

A reset gate 32 is also formed on insulating layer 22 adjacent and between n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source $V_{DD}$, e.g., 5 volts. The transfer and reset transistors 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source $V_{DD}$ and the drain of transistor 38 coupled to a lead 42. The drain of row select transistor 38 is connected via conductor 42 to the drains of similar row select transistors for other pixels in a given pixel row. A load transistor 39 is also coupled between the drain of transistor 38 and a voltage source $V_{SS}$, e.g. 0 volts. Transistor 39 is kept on by a signal $V_{IN}$ applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage $V_{SS}$. The upper side of the capacitor 64 is also connected to the gate of a p-channel output transistor 66. The drain of the output transistor 66 is connected through a column select transistor 68 to a signal sample output node $V_{OUTS}$ and through a load transistor 70 to the voltage supply $V_{DD}$. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage $V_{SS}$. The upper side of the capacitor 74 is also connected to the gate of a p-channel output transistor 76. The drain of the output transistor 76 is connected through a p-channel column select transistor 78 to a reset sample output node $V_{OUTR}$ and through a load transistor 80 to the supply voltage $V_{DD}$. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages $V_{OUTR}$ and $V_{OUTS}$ of the readout circuit 60. These voltages are then subtracted ($V_{OUTS}-V_{OUTR}$) by subtractor 82 to provide an output signal terminal 81 which is an image signal independent of pixel to pixel variations caused by fabrication variations in the reset voltage transistor 31 which might cause pixel to pixel variations in the output signal.

FIG. 2 illustrates a block diagram for a CMOS imager having a pixel array 200 with each pixel cell being constructed in the manner shown by element 14 of FIG. 1. FIG. 4 shows a 2×2 portion of pixel array 200. Pixel array 200 comprises a plurality of pixels arranged in a predetermined number of columns and rows. The pixels of each row in array 200 are all turned on at the same time by a row select line, e.g., line 86, and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

FIG. 3 shows a simplified timing diagram for the signals used to transfer charge out of photodetector circuit 14 of the FIG. 1 CMOS imager. The photogate signal PG is nominally set to 5V and pulsed from 5V to 0V during integration. The reset signal RST is nominally set at 2.5V. As can be seen from the figure, the process is begun at time t0 by briefly pulsing reset voltage RST to 5V. The RST voltage, which is applied to the gate 32 of reset transistor 31, causes transistor 31 to turn on and the floating diffusion node 30 to charge to the $V_{DD}$) voltage present at n+ region 34 (less the voltage drop $V_{TH}$ of transistor 31). This resets the floating diffusion node 30 to a predetermined voltage ($V_{DD}-V_{TH}$). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor output voltage on line 42 representing the reset charge present at floating diffusion node 30. The PG signal is next pulsed to 0 volts, causing charge to be collected in n+ region 26.

A transfer gate voltage TX, similar to the reset pulse RST, is then applied to transfer gate 28 of transistor 29 to cause the charge in n+ region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

The operation of the charge collection of the CMOS imager is known in the art and is described in several publications such as Mendis et al., "Progress in CMOS Active Pixel Image Sensors," SPIE Vol. 2172, pp. 19–29 (1994); Mendis et al., "CMOS Active Pixel Image Sensors for Highly Integrated Imaging Systems," IEEE Journal of Solid State Circuits, Vol. 32(2) (1997); and Eric R. Fossum, "CMOS Image Sensors: Electronic Camera on a Chip," IEDM Vol. 95, pp. 17–25 (1995) as well as other publications. These references are incorporated herein by reference.

The pixel cell 14 shown in FIG. 1 contains a transfer transistor 29 having a gate stack 28, a source n+ region 26 and a drain floating diffusion region 30. Because the transfer gate stack 28 is separated from the photogate 24 by a relatively wide gap, e.g., 0.25 microns, the presence of a coupling region 26 is necessary to electrically couple the photogate 24 to the transfer gate stack 28. When a signal TX is applied to the transfer gate stack 28, the coupling region 26 functions as a conducting channel to pass charges from the doped layer 27 under the photogate into the channel region of the transfer transistor 29, and then to the floating diffusion region 30. Although this pixel cell 14 is simple to fabricate because it is a single polysilicon process, i.e., it uses a single layer of polysilicon as the gate layer in the photogate 24, transfer gate 28 and reset gate 32, it has the disadvantages of added noise and incomplete charge transfer as a result of having to incorporate the diffused region 26.

To overcome these disadvantages, double polysilicon structures have been developed in which the photogate 24 and reset gate 32 are formed using the same layer of polysilicon. After spacer formation the top surface of all polysilicon gates are then oxidized, and then a transfer gate 28 is formed from a second layer of polysilicon that overlaps the photogate 24 to some degree. The overlapping of the photogate 24 and the transfer gate 28 with only a thin, e.g., less than 100 nm, layer of spacer insulator between them permits electrical coupling to occur between the doped layer 27 underlying the photogate 24 and the floating diffusion region 30. No coupling region 26 is required for this pixel cell 14. Although this pixel cell 14 provides improved control over the potential stored in the 100 nm overlapping region between the edge of the photogate 24 and the transfer gate 28, and results in increased charge transfer from the doped layer 27 to the floating diffusion region 30, there are significant processing difficulties in the fabrication methods used to create the pixel cell 14. The oxidation of the photogate stack 24 prior to transfer gate stack 28 formation results in asperities, points, and other defects in the oxide layer insulating the transfer gate polysilicon from the photogate polysilicon, resulting in low breakdown of the insulating gate oxide between these two overlying polysilicons, improper electrical functioning, and poor processing yield. Additionally, this oxidation of the first poly silicon layer, prior to the deposition of the second polysilicon layer which will form the transfer gate 28, forms the second gate oxide under the transfer gate. As geometries have shrunk to improve performance and yield, the gate oxide must be grown thinner maintain low threshold voltages and maintain performance at the shorter geometries. So the thinning of the second gate oxide continues to cause a degradation in the breakdown voltage between these two overlapping polysilicon layers.

This process also suffers from the alignment required to do the masked implant of the n-doped region 27, requiring careful alignment so that the doped region 27 does not extend across the transfer gate 28 which will be formed in later processing. In order to achieve this the transfer gate 28 is made larger to account for implant misalignment errors. This process also suffers from the fact that all transistors formed by the first polysilicon deposition including the photogate 24 and reset gate 32 cannot be silicide gates, which would improve circuit speed and performance, because of two reasons: (1) the top silicide cannot be oxidized to provide a reliable insulating oxide between the photogate 24 and the transfer gate 28 and (2) a silicide layer on top of the photogate would block signal light from passing through the photogate into the signal storage region 27 below the photogate.

There is needed, therefore, an improved multi-layered gate structure formed with an overlapping second gate so that a doped region is not required to transfer charge between the two gates. Also needed is a multi-layered transfer gate 28 and an overlapping photogate 24, or a multi-layered photogate 24 with an overlapping transfer gate 28 so that a n-doped region 26 is not required. A method of fabricating a multi-layered gate that solves the reduced process yield associated with the low photogate polysilicon to transfer polysilicon breakdown voltage is needed. It would also be advantageous if this new method would also provide silicided gates for improved speed and circuit performance while simultaneously allowing signal light to pass through the photogate.

SUMMARY OF THE INVENTION

The present invention provides a multi-layered gate stack process for use in fabricating a pixel sensor cell. The multi-layered gates have multiple layers including a conductive laver, an optional silicide layer, and an insulating layer, all of which are patterned and etched simultaneously over a first insulating layer. Also provided are methods for forming the multi-layered gates of the present invention, and a process that achieves high yield overlap process for a photogate—transfer gate overlap that does not require the n-doped region 26. The combination of a multi-layered gate and an overlapping gate may be a multi-layered transfer gate with an overlapping photogate, a multi-layered photogate with an overlapping transfer gate, a multi-layered source follower gate with an overlapping row select gate, a multi-layered row select gate with an overlapping source follower gate, or any other suitable combination.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an imager will proceed simultaneously in a similar fashion. The following detailed description is, therefore, not to be taken in a limiting sense, and the scope of the present invention is defined by the appended claims.

Figure 5:
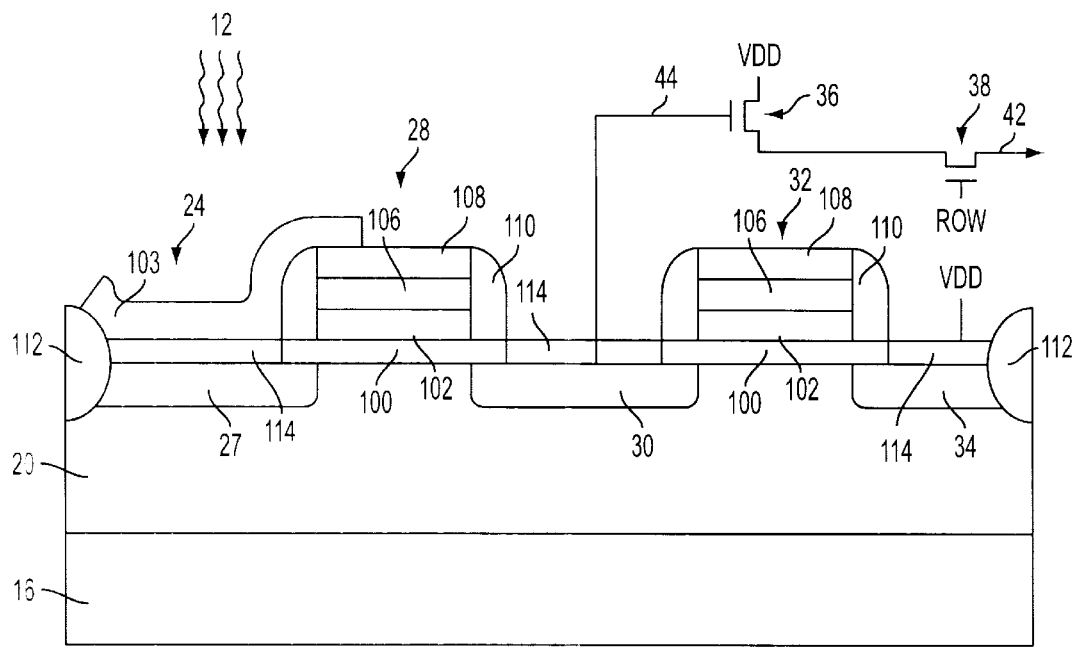
FIG. 5 is a cross-sectional view of a pixel sensor cell according to one embodiment of the present invention.

The structure of the pixel cell 14 of the first embodiment is shown in more detail in FIG. 5. The pixel cell 14 may be formed in a substrate 16 having a doped layer or well 20 of a first conductivity type, which for exemplary purposes is treated as a p-type substrate. Three gate stacks are formed in the pixel cell 14 as shown: a multi-layered transfer gate stack 28, a multi-layered reset transistor gate stack 32 of the reset transistor 31, and a semitransparent photogate conductor 24 formed partially over the multi-layered transfer gate stack 28. In between the reset transistor gate 32 and the transfer gate 28 is a doped region 30 that is the source for the reset transistor 31, and on the other side of the reset transistor gate 32 is a doped region 34 that acts as a drain for the reset transistor. The doped regions 30, 34 are doped to a second conductivity type, which for exemplary purposes is treated as n-type. The first doped region 30 is the floating diffusion region, sometimes also referred to as a floating diffusion node, and the second doped region 34 is connected to voltage source Vdd.

The multi-layered transfer gate stack 28 and the multi-layered reset gate stack 32 include a first insulating layer 100 of grown or deposited silicon oxide on the doped layer 20, and a conductive layer 102, such as doped polysilicon or other suitable material, over the first insulating layer 100. A second insulating layer 108 of, for example, silicon oxide (silicon dioxide), nitride (silicon nitride), oxynitride (silicon oxynitride), ON (oxide-nitride), NO (nitride-oxide), or ONO (oxide-nitride-oxide) may be formed, if desired; also a silicide layer 106 may be formed in the multi-layered gate stacks 28, 32, between the conductive layer 102 and the second insulating layer 108, if desired. Advantageously, all other transistors in the imager circuit design, except for the photogate, may have this additionally formed silicide layer, thus improving gate delay and increasing circuit speed. This silicide layer may be titanium silicide, tungsten silicide, cobalt silicide, molybdenum silicide, or tantalum silicide. Layer 106 could also be a barrier layer/refractory metal such as TiN/W or $WN_x$/W or is it could be entirely formed of $WN_x$. The implanted n-doped region 27 is self-aligned to the transfer gate edge and forms a photosensitive charge storage region for collecting photogenerated electrons. Insulating sidewalls 110 of, for example, silicon dioxide, silicon nitride, silicon oxynitride, ON, NO, or ONO are also formed on the sides of the gate stacks 28, 32. The photogate stack 24 includes a first insulating layer 114 formed over the n-doped layer 27, and a conductive layer 103 of doped polysilicon, tin oxide, indium tin oxide, or other suitable semitransparent conductive material over the first insulating layer 114.

The so-formed photogate 24 is isolated from the multi-layered transfer gate stack 28 by the combination of the spacers 110 and the second insulating layer 108. These layers can be made relatively thick without sacrificing imager or circuit performance and thus achieve good isolation between the photogate and the transfer gate, high breakdown voltages, and high yield. This new processing method does not depend on the non-uniform growth of an oxide on a polysilicon layer to provide isolation between two gates.

Because the transfer gate stack 28 has a second insulating layer 108, and the conductive 106 and silicide 108 layers of the transfer gate stack 28 are isolated on the sides by sidewall spacers 110, there is so-formed a uniformly thick isolation free of asperities and points that enables high breakdown voltages and high yield. The relative thickness and smoothness of the isolating insulators 108, 110 enables the formation thereon of a substantially defect-free gate layer 103 of the photogate 24. Because the structural quality of the insulating layers 108, 110 and the gate layer 103 is improved over structures known in the art, there are fewer electrical defects in photogate to transfer gate isolation of the present invention, and processing yields are improved. Also note that the edge of the photogate conductive layer 103 is self-aligned to the edge of the transfer gate 28 so that no intervening doped region 26 is required as has been the case with past single polysilicon processes. In the case of FIG. 5, the first gate oxide 100 is grown just before depositing the first conductive layer 102 and the second gate oxide 114 is grown just before depositing a second conductive layer 103 which is, in the case of FIG. 5, a semitransparent layer that forms the photogate.

As light radiation 12 in the form of photons passes through the semitransparent photogate 24, electron-hole pairs are created in the underlying silicon substrate and electrical carriers are stored in the doped layer 27 underneath the photogate 24. The carriers may be either electrons or holes, depending on the types of devices used in the pixel sensor cell 14. In the exemplary pixel cell 14 having n-channel devices formed in a p-type doped layer 20, the stored carriers are electrons. When a signal TX is applied to the conductive layer 106 of the transfer gate stack 28, the transfer gate is turned on and electrical coupling occurs due to the narrow gap between the photogate 24 and the transfer gate stack 28, and the coupling capacitance and electrical fringing fields between these two devices, and carriers are transferred from the doped layer 27 under the photogate into the floating diffusion region 30.

Figure 6:
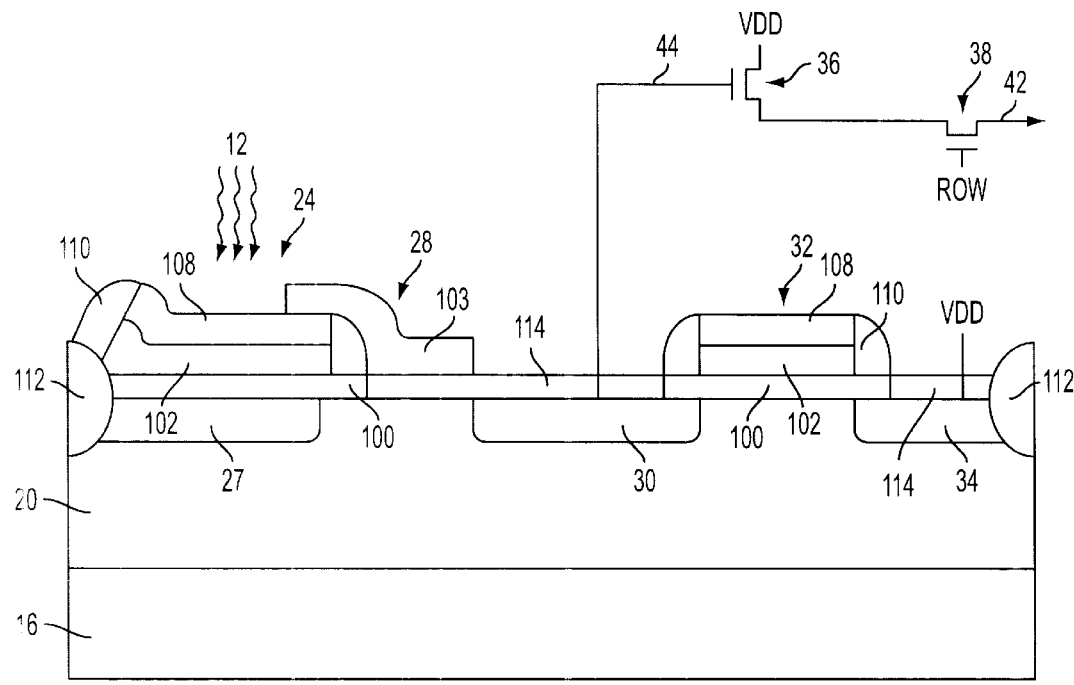
FIG. 6 is a cross-sectional view of a pixel sensor cell according to a second embodiment of the present invention.

A multi-layered photogate 24 with an overlapping transfer gate 28, as shown in FIG. 6, works in essentially the same fashion as is described above for the multi-layered transfer gate 28 with an overlapping photogate 24. The design of the gates is varied as necessary to achieve proper electrical functioning of the device, for example, the multi-layered photogate 24 of FIG. 6 would not have the optional silicide layer 106. On the other hand, the overlapping transfer gate in FIG. 6 could have a silicide or barrier metal/refractory metal layer over the polysilicon layer 103. Similar to FIG. 5, the first gate oxide 100 is grown just before depositing the first conductive layer 102, and the second gate oxide 114 is grown just before depositing the second conductive layer 103 which is, in the case of FIG. 6, the transfer gate.

Figure 7:
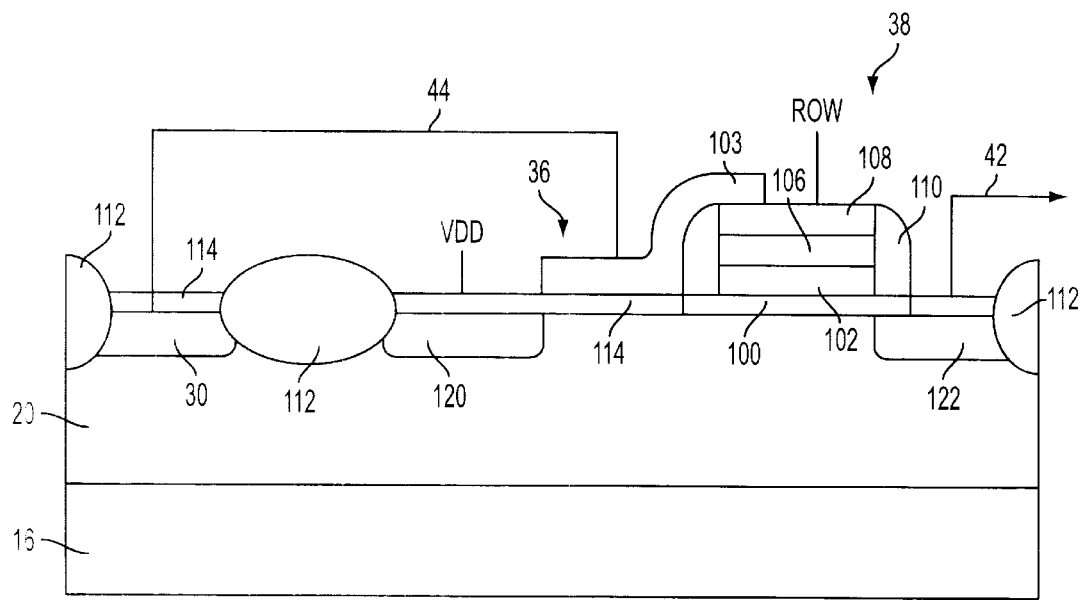
FIG. 7 is a cross-sectional view of a pixel sensor cell according to a third embodiment of the present invention.
Figure 8:
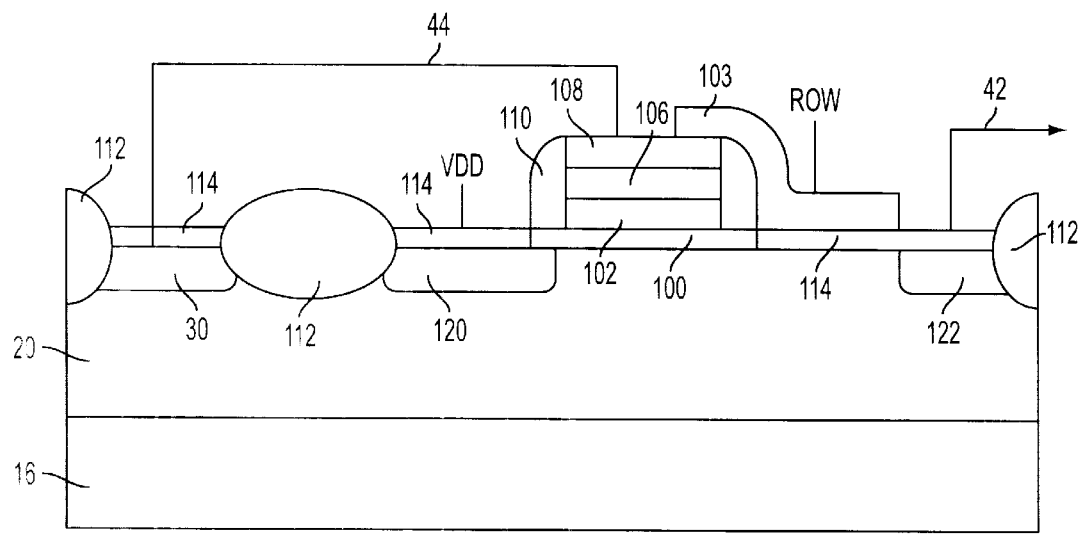
FIG. 8 is a cross-sectional view of a pixel sensor cell according to a fourth embodiment of the present invention.

Other gates in the pixel cell may be formed to overlap, as is shown in FIGS. 7 and 8, which depict, respectively, a multi-layered row select gate 38 with an overlapping source follower gate 36, and a multi-layered source follower gate 36 with an overlapping row select gate 38. Charge on the floating diffusion region 30 is connected to the source follower gate 36 via lead 44. This charge regulates the degree to which the source follower transistor is turned on. If the row select gate 38 is also turned on by signal ROW, then current flows between source region 120 and drain region 122, and via lead 42 to signal processing circuitry located outside the pixel array. In these two applications the overlapping gate may have a silicide or barrier/refractory metal layer over the polysilicon layer 103 and may also have an overlapping insulating layer.

Figure 9:
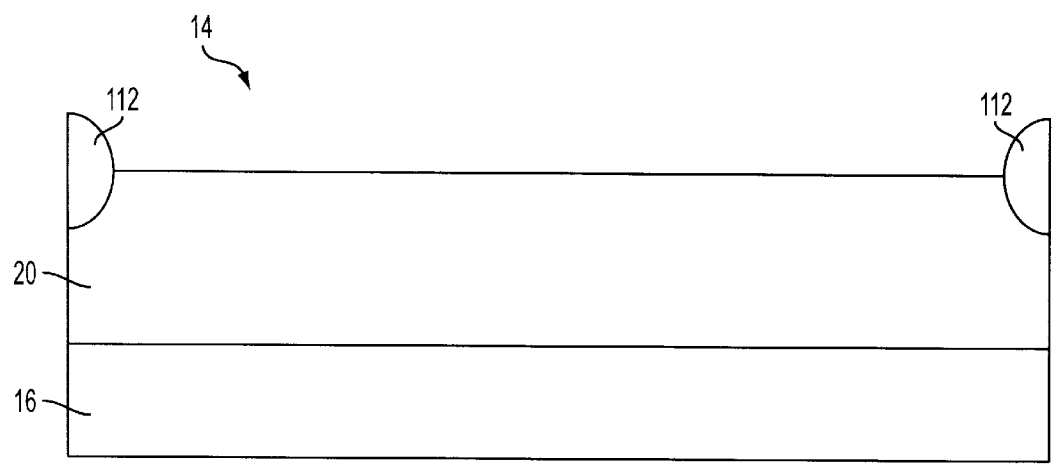
FIG. 9 is a cross-sectional view of a semiconductor wafer undergoing the process of a preferred embodiment of the invention.

The multi-layered transfer gate 28 is manufactured through a process described as follows, and illustrated by FIGS. 9 through 18. Referring now to FIG. 9, a substrate 16, which may be any of the types of substrates described above, is doped to form a doped substrate layer or well 20 of a first conductivity type, which for exemplary purposes will be described as p-type. The process sequence described and illustrated below provides for the formation of n-channel devices in a p-type substrate. It follows that the invention may also be carried out by forming p-channel devices in an n-type substrate by substitution of the appropriately doped materials and addition of appropriate masks. Also, p-channel and n-channel devices may be formed in the same substrate.

For exemplary purposes, the fabrication of a multi-layered transfer gate with an overlapping photogate is described and illustrated herein, but the process of the present invention is not limited thereto. Fabrication of the other embodiments of the present invention such as a multi-layered row select gate with an overlapping source follower gate would proceed substantially as described below.

The processing is shown in FIG. 9 after the field oxide isolation is completed. Field isolation is used to isolate doped or conductive regions to be later formed in the silicon substrate. Field oxidation by the LOCOS process which involves a thermal oxidation of the silicon is shown. However, it is well known to those skilled in the art that one may substitute a shallow trench isolation (STI) process which involves the deposition of an oxide into trenches etched into the silicon.

Figure 10:
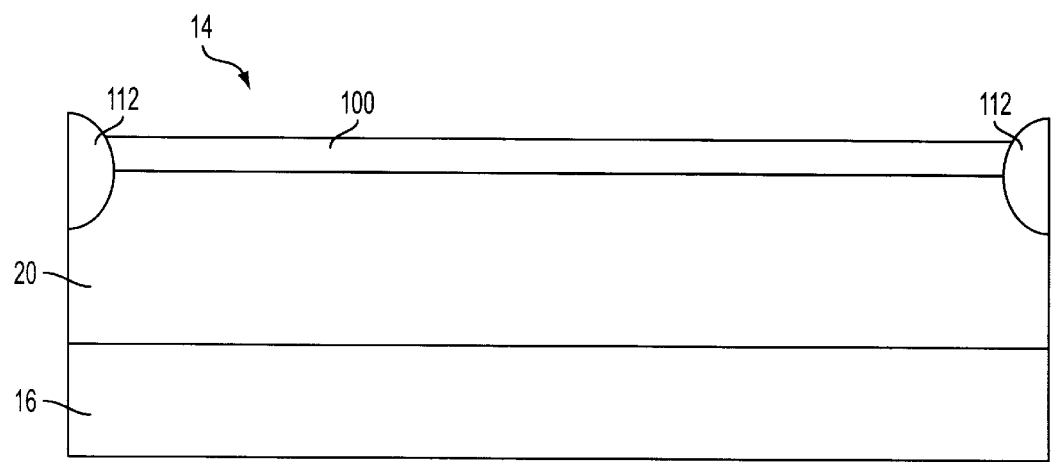
FIG. 10 shows the wafer of FIG. 9 at a processing step subsequent to that shown in FIG. 9.
Figure 11:
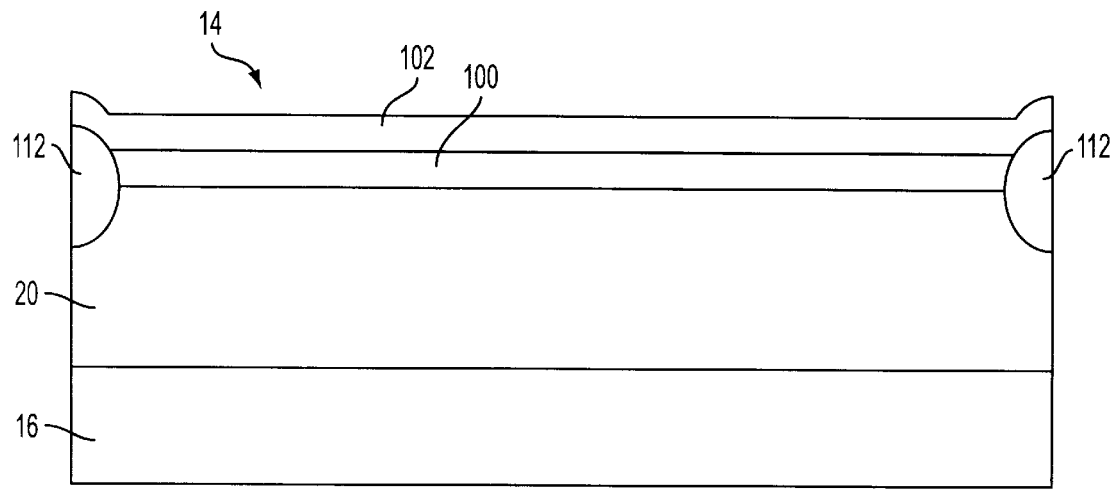
FIG. 11 shows the wafer of FIG. 9 at a processing step subsequent to that shown in FIG. 10.

As shown in FIG. 10, the next step is to form a first insulating layer 100 of silicon oxide, silicon nitride, silicon oxynitride, ON, NO, or ONO, on the top of the doped layer 20 by suitable means such as growth by thermal oxidation of the doped layer 20, or by deposition. Next, as shown in FIG. 11, a first conductive layer 102 is formed, by chemical vapor deposition (CVD), or other suitable means, on top of the first insulating layer 100. The first conductive layer 102 may be doped polysilicon and is preferably about 10 to 500 nm thick.

Figure 12:
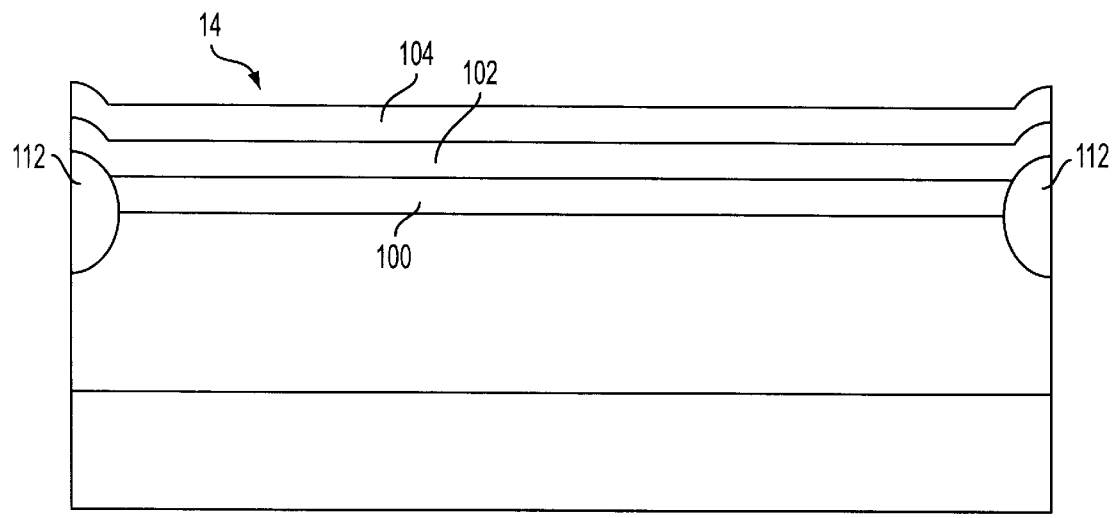
FIG. 12 shows the wafer of FIG. 9 at a processing step subsequent to that shown in FIG. 11.
Figure 13:
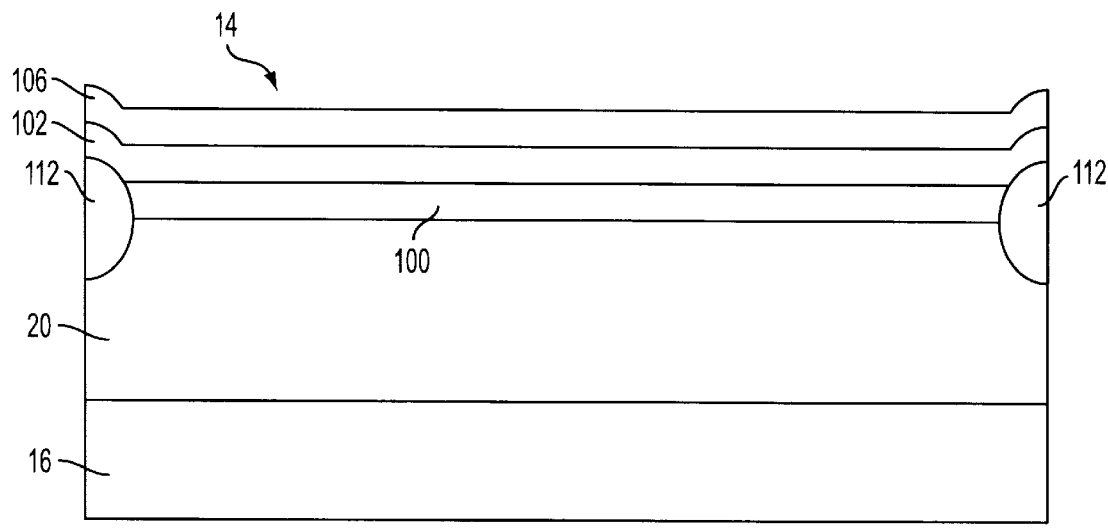
FIG. 13 shows the wafer of FIG. 9 at a processing step subsequent to that shown in FIG. 12.

Referring now to FIGS. 12 and 13, the next step in the process is the formation of a silicide layer, if desired. In one embodiment, a metal layer 104 is formed on top of the first conductive layer 102 by suitable means such as CVD, evaporation, or sputtering. Next, a silicide layer 106 is formed by annealing the metal layer 104 at a temperature within the approximate range of 300 to 900 degrees Celsius. A second embodiment is to deposit the silicide layer 106 directly onto the first conductive layer 102 by CVD or other suitable means. The metal silicide may be any suitable metal silicide such as the silicides of tungsten, titanium, molybdenum, tantalum, platinum, palladium, iridium or cobalt. In a third embodiment the metal layer could be a deposited barrier metal/metal conductor layer combination such as TiN/W, $WN_x$/W, or any other suitable barrier metal/metal conductor combination such as $WN_x$ alone, and it may be deposited by CVD, evaporation, or sputtering.

Figure 14:
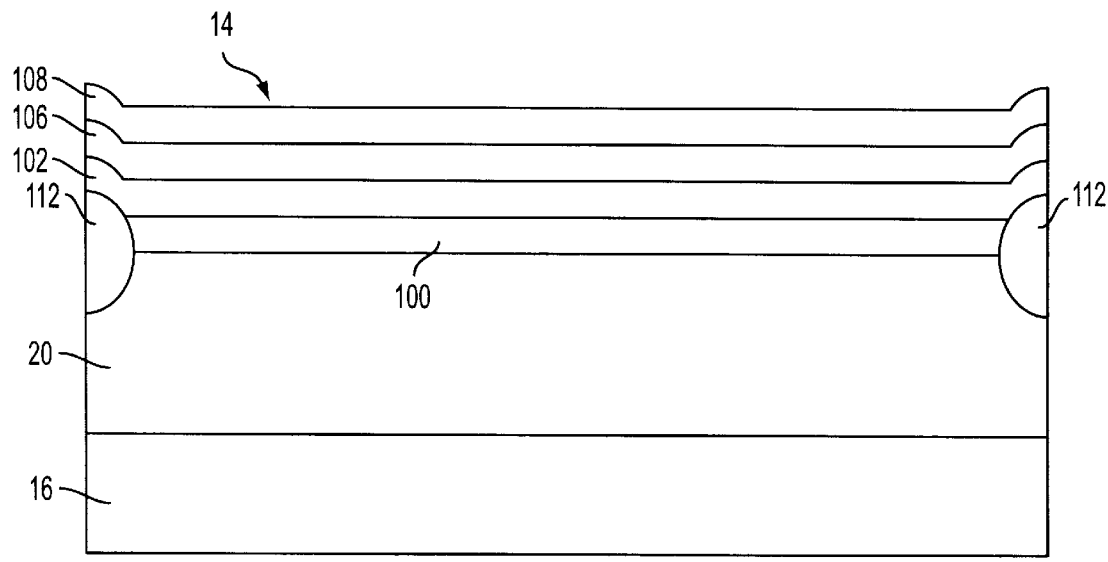
FIG. 14 shows the wafer of FIG. 9 at a processing step subsequent to that shown in FIG. 13.

FIG. 14 depicts the next step in the process, in which a second insulating layer 108 is formed on the silicide layer 106 by CVD, or other suitable means. The second insulating layer may be formed from any suitable material such as silicon oxide, silicon nitride, ONO, ON, or NO. It is to be understood that the oxide layers could also be a silicum rich oxide layer commonly used as an inorganic ARC layer (anti-reflection coating), which additionally improves photo patterning.

Figure 15:
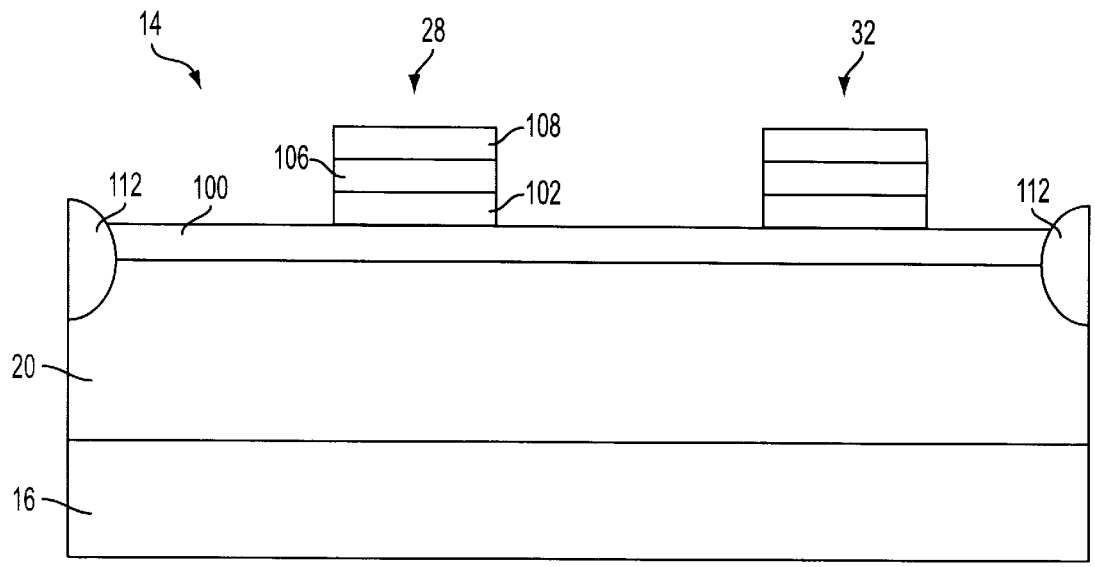
FIG. 15 shows the wafer of FIG. 9 at a processing step subsequent to that shown in FIG. 14.

Referring now to FIG. 15, the next step is to define gate stacks. A resist (not shown) and mask (not shown) are applied, and photolithographic techniques are used to define the areas which will be gate stacks across the wafer. A suitable removal process such as RIE or other directional etching is used to remove the second insulating layer 108, the silicide layer 106, and the first conductive layer 102 to leave a transfer gate stack 28, a reset transistor gate stack 32, and the first insulating layer 100 on the surface of the wafer. Alternatively, the first insulating layer 100 may also be partially removed from the surface of the wafer in the regions exposed to the etch. Other transistors in the imaging pixel such as the source follower transistor and the row select transistor are similarly formed though not shown at this time. Also any peripheral logic transistors can be advantageously so formed at this point in the processing.

Figure 16:
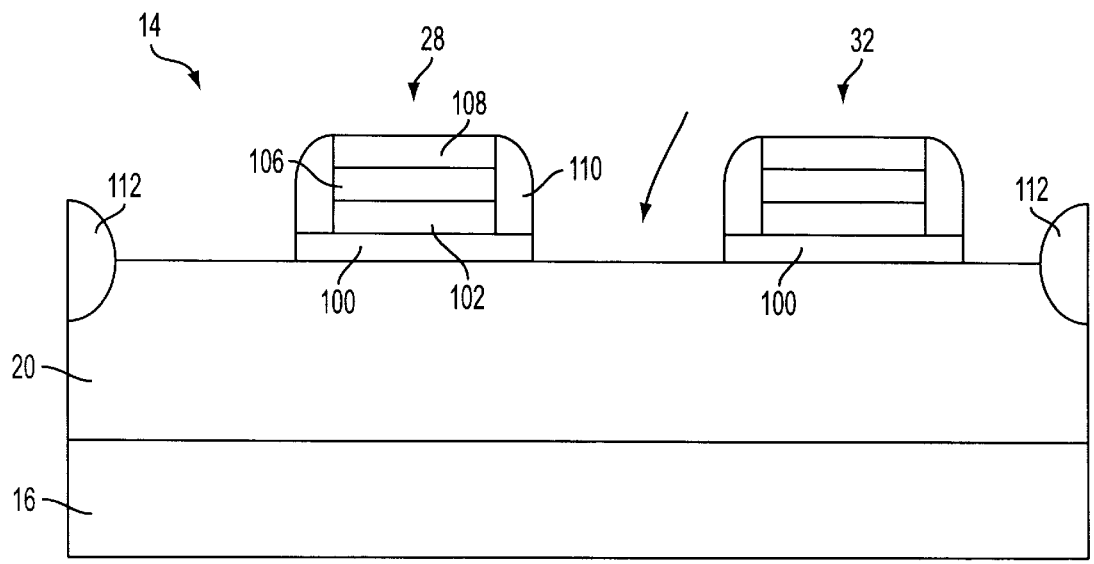
FIG. 16 shows the wafer of FIG. 9 at a processing step subsequent to that shown in FIG. 15.

Next, as shown in FIG. 16, spacers or sidewalls 110 are formed on the sides of the gate stacks 28, 32. The sidewalls 110 may be formed of deposited insulation materials such as silicon oxide, silicon nitride, silicon oxynitride, or ONO or ON or NO. After deposition of the insulating material it is etched using an anisotropic dry etch that forms the sidewall spacers. This anisotropic etch may partially or completely remove the remaining first insulating layer 100. FIG. 16 shows the gate oxide 100 to be completely removed by the spacer overetch in the regions where the gate oxide is not protected by the overlapping gate stack.

Figure 17:
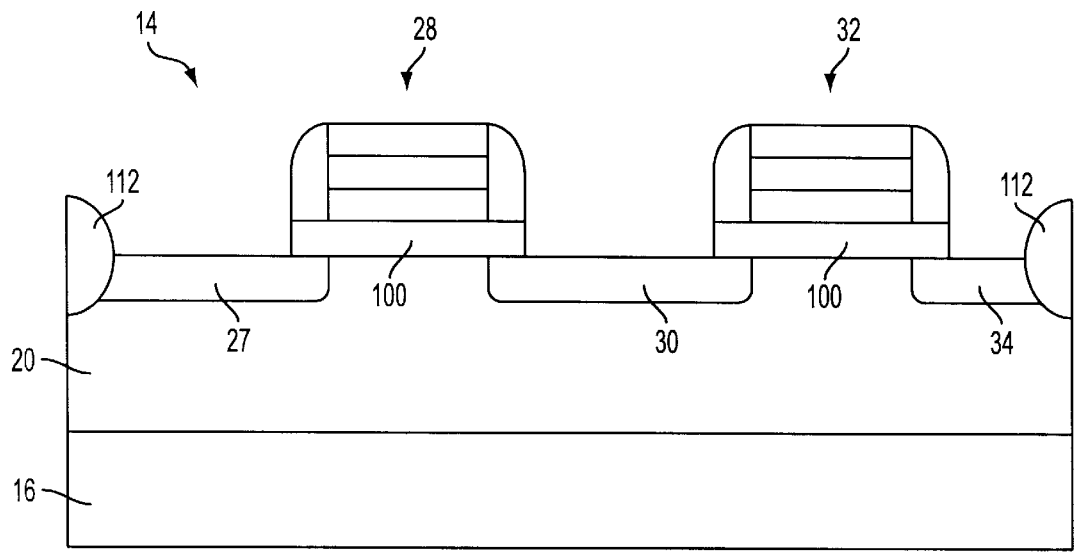
FIG. 17 shows the wafer of FIG. 9 at a processing step subsequent to that shown in FIG. 16.

As shown in FIG. 17, after the spacers are formed, the masked source-drain implant 34, the masked floating diffusion implant 30, and the self-aligned masked photogate implant 27 are performed. For the case of n-channel devices in a p-well 20, these are all n-type implants such as arsenic, antimony, or phosphorus. It is possible with some sacrifice in performance to save costs by implanting these regions with just one or two masks rather than the three indicated herein. The implants diffuse under subsequent thermal treatment. In FIG. 17 we show these diffused, implanted regions after those thermal steps have occurred. There will be other masked implantations to improve transistor performance, set Vt's, etc., which for sake of simplicity, are not shown.

Figure 18:
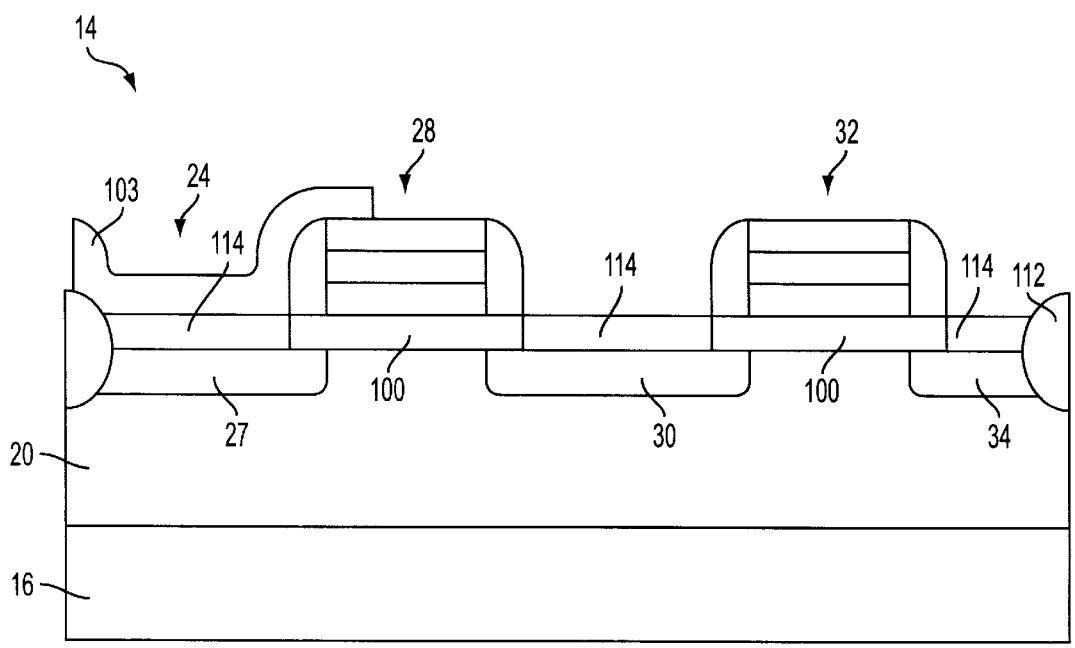
FIG. 18 shows the wafer of FIG. 9 at a processing step subsequent to that shown in FIG. 17.

As shown in FIG. 18, the next step is to form the photogate 24. A second insulating layer 114 is formed or reformed on the silicon substrate by suitable means such as growth by thermal oxidation. Next, a second conductive layer 103 is deposited, by CVD, or other suitable means, on top of the second insulating layer 114. The second conductive layer 103 may be doped polysilicon or other suitable semitransparent conductive material such as tin oxide or indium tin oxide, and is preferably about 10 to 500 nm thick. A resist (not shown) and mask (not shown) are applied to selectively pattern an area where the photogate 24 is to be formed. The photogate is then etched by suitable wet or dry etching methods, preferably by an anisotropic dry etch. FIG. 18 show the reset, transfer, and photogates in the imager after the photogate has been patterned, etched and the resist patterning layers removed.

Figure 1:
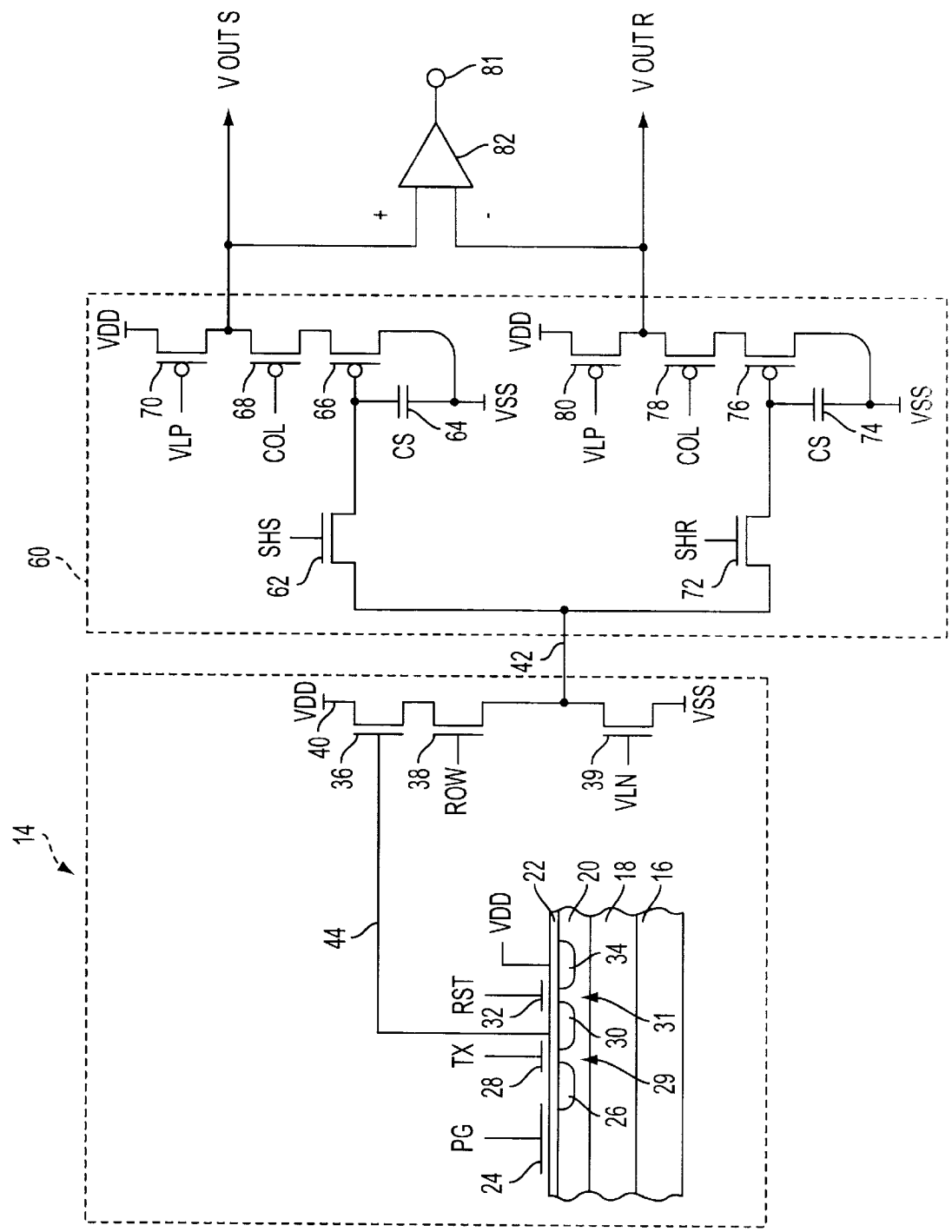
FIG. 1 is a representative circuit of a CMOS imager.
Figure 2:
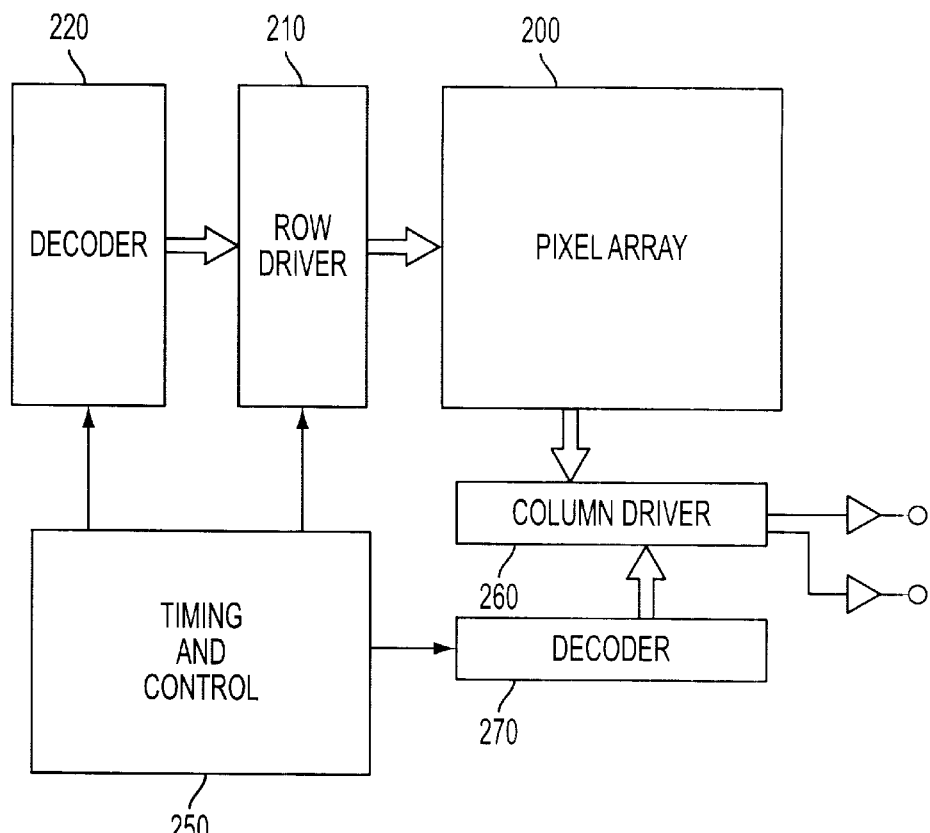
FIG. 2 is a block diagram of a CMOS pixel sensor chip.
Figure 3:
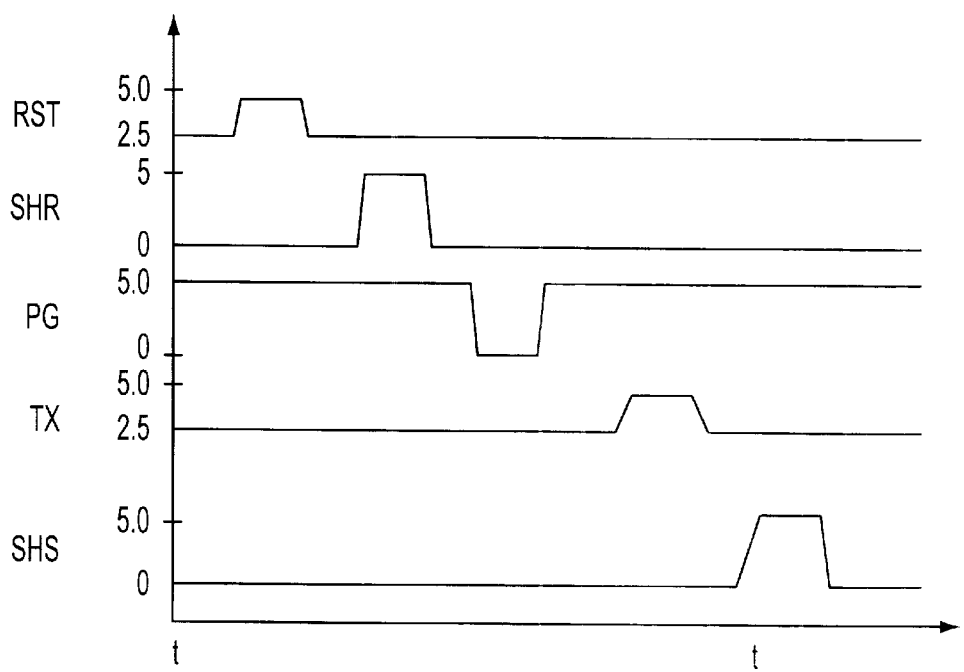
FIG. 3 is a representative timing diagram for the CMOS imager.
Figure 4:
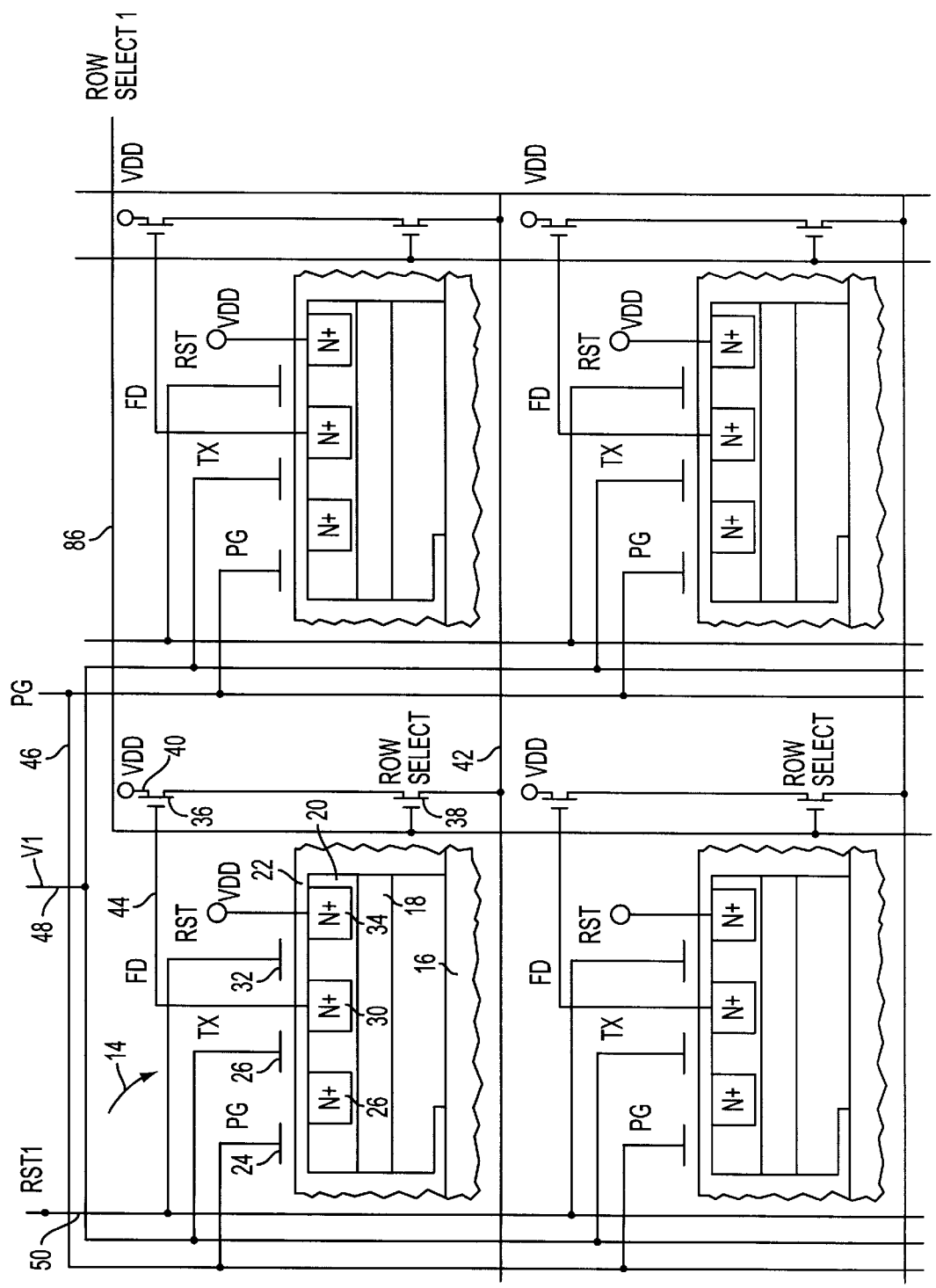
FIG. 4 is a representative pixel layout showing a 2×2 pixel layout.

The multi-layered gate process with overlapping gates is essentially complete at this stage, and conventional processing methods may then be used to form contacts and wiring to connect gate lines and other connections in the pixel cell 14. For example, the entire surface may then be covered with a passivation layer of, e.g., silicon dioxide, BSG, PSG, or BPSG, which is CMP planarized and etched to provide contact holes, which are then metallized to provide contacts to the photogate, reset gate, and transfer gate. Conventional multiple layers of conductors and insulators may also be used to interconnect the structures in the manner shown in FIG. 1. Pixel arrays having the transfer gates of the present invention, and described with reference to FIGS. 5–18, may be further processed as known in the art to arrive at CMOS imagers having the functions and features of those discussed with reference to FIGS. 1–4.

Figure 19:
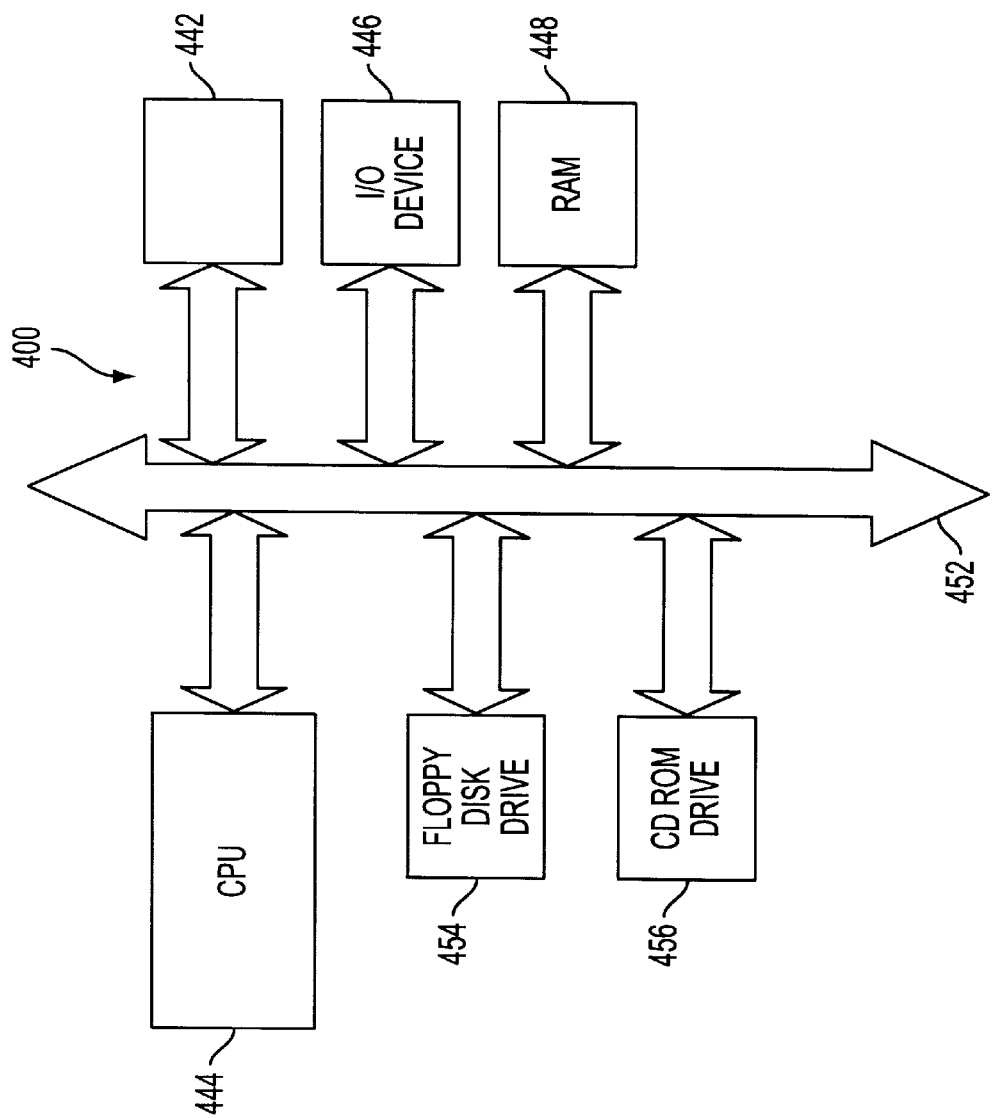
FIG. 19 is an illustration of a computer system having a CMOS imager according to the present invention.

A typical processor based system which includes a CMOS imager device according to the present invention is illustrated generally at 400 in FIG. 19. A processor based system is exemplary of a system having digital circuits which could include CMOS imager devices. Without being limiting, such a system could include a computer system, camera system, scanner, machine vision system, vehicle navigation system, video telephone, surveillance system, auto focus system, star tracker system, motion detection system, image stabilization system and data compression system for high-definition television, all of which can utilize the present invention.

A processor system, such as a computer system for example generally comprises a central processing unit (CPU) 444, e.g., a microprocessor, that communicates with an input/output (I/O) device 446 over a bus 452. The CMOS imager 442 also communicates with the system over bus 452. The computer system 400 also includes random access memory (RAM) 448, and, in the case of a computer system may include peripheral devices such as a floppy disk drive 454 and a compact disk (CD) ROM drive 456 which also communicate with CPU 444 over the bus 452. CMOS imager 442 is preferably constructed as an integrated circuit which includes pixels containing a multi-layered gate, as previously described with respect to FIGS. 5 through 18. The CMOS imager 442 may be combined with a processor, such as a CPU, digital signal processor or microprocessor, with or without memory storage, in a single integrated circuit, or may be on a different chip than the processor.

As can be seen by the embodiments described herein, the present invention encompasses multi-layered gates in a pixel sensor cell that are at least partially overlapped by an adjacent gate. The multi-layered gate is a complete gate stack and exhibits improved insulation from the overlapping gate, thereby resulting in fewer shorts between the two gates. The process embodiments described herein enable formation of a multi-layered gate with improved yield and reliability.

It should again be noted that although the invention has been described with specific reference to CMOS imaging circuits having a photogate and a floating diffusion region, the invention has broader applicability and may be used in any CMOS or CCD imaging apparatus where overlapping gates are required or advantageous. Similarly, the process described above is but one method of many that could be used. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A pixel sensor cell for use in an imaging device, said pixel sensor cell comprising:
    a photosensitive region of a first conductivity type formed on a substrate;
    a floating diffusion region of a second conductivity type formed in the substrate and spaced from said photosensitive region;
    a first insulating layer formed on said substrate;
    a first gate formed on said first insulating layer over said photosensitive region, said first gate comprising a first conductive layer on a first portion of said first insulating layer, a second insulating layer on the first conductive layer, and insulating spacers for defining structure in said substrate, said insulating spacers being formed on the sides of said first gate; and
    a second gate formed on a second portion of said first insulating layer, said second portion of said first insulating layer overlying said structure in said substrate, and said second gate comprising a semitransparent conductive layer formed on said second insulating layer and extending at least partially over said first gate.

2. The pixel sensor cell of claim 1, wherein the first insulating layer is a layer selected from the group consisting of silicon oxide, silicon nitride, silicon oxynitride, ON, NO, and ONO.

3. The pixel sensor cell of claim 1, wherein the first conductive layer is a layer of doped polysilicon.

4. The pixel sensor cell of claim 1, wherein said first gate further comprises a barrier metal layer on the first conductive laver.

5. The pixel sensor cell of claim 4, wherein the barrier metal is titanium nitride.

6. The pixel sensor cell of claim 4, wherein the barrier metal is tungsten nitride.

7. The pixel sensor cell of claim 4, wherein said first gate further comprises a tungsten layer on the barrier metal layer.

8. The pixel sensor cell of claim 1, wherein said first gate further comprises a silicide layer on the first conductive layer.

9. The pixel sensor cell of claim 8, wherein the silicide layer is a layer of metal silicide selected from the group consisting of titanium silicide, tungsten silicide, molybdenum silicide, tantalum silicide, platinum silicide, palladium silicide, iridium silicide, and cobalt silicide.

10. The pixel sensor cell of claim 1, wherein the second insulating layer is a deposited silicon oxide layer.

11. The pixel sensor cell of claim 1, wherein the second insulating layer material is silicon nitride.

12. The pixel sensor cell of claim 1, wherein the second insulating layer is ON.

13. The pixel sensor cell of claim 1, wherein the second insulating layer is NO.

14. The pixel sensor cell of claim 1, wherein the second insulating material is ONO.

15. The pixel sensor cell of claim 1, wherein the insulating spacers are silicon oxide spacers.

16. The pixel sensor cell of claim 1, wherein the insulating spacers are silicon nitride spacers.

17. The pixel sensor cell of claim 1, wherein the insulating spacers are silicon oxynitride spacers.

18. The pixel sensor cell of claim 1, wherein the insulating spacers are ON spacers.

19. The pixel sensor cell of claim 1, wherein the insulating spacers are NO spacers.

20. The pixel sensor cell of claim 1, wherein the insulating spacers are ONO spacers.

21. The pixel sensor cell of claim 1, wherein the second conductive layer is a layer of doped polysilicon.

22. The pixel sensor cell of claim 1, wherein the second conductive layer is a layer of semitransparent conductive material.

23. The pixel sensor cell of claim 22, wherein the semitransparent conductive material is tin oxide.

24. The pixel sensor cell of claim 22, wherein the semitransparent conductive material is indium tin oxide.

25. The pixel sensor of claim 22, wherein the semitransparent conductive material is a laver of doped polysilicon.

26. The pixel sensor cell of claim 1, wherein said second gate further comprises a barrier metal layer on the second conductive layer.

27. The pixel sensor of claim 26, wherein the barrier metal is titanium nitride.

28. The pixel sensor of claim 26, wherein the barrier metal is tungsten nitride.

29. The pixel sensor cell of claim 26 wherein said second gate further comprises a tungsten layer on the barrier metal layer.

30. The pixel sensor cell of claim 1, wherein said second gate further comprises a silicide layer on the second conductive layer.

31. The pixel sensor cell of claim 1, wherein the imaging device is a CMOS imager.

32. The pixel sensor cell of claim 1, wherein the imaging device is a CCD imager.

33. The pixel sensor cell of claim 1, wherein said first gate is a source follower gate, and said second gate is a row select gate.

34. The pixel sensor cell of claim 1, wherein said first gate is a row select gate, and said second gate is a source follower gate.

35. The pixel sensor cell of claim 1, wherein said first gate is a transfer gate and said second gate is a photogate.

36. The pixel sensor cell of claim 1, wherein said first gate is a photogate and said second gate is a transfer gate.

37. A pixel sensor cell for use in an imaging device, said pixel sensor cell comprising:
    a photosensitive region of a first conductivity type formed in a substrate;
    a floating diffusion region of a second conductivity type formed in the substrate and spaced from said photosensitive region;
    a first insulating layer formed on the substrate;
    a first gate formed on said first insulating layer over said photosensitive region, said first gate comprising a first conductive layer on said first insulating layer, a second insulating layer on the first conductive layer, and insulating spacers formed on the sides of said first gate; and
    a second gate formed on said first insulating layer, said second gate comprising a semitransparent conductive layer formed on said first insulating layer and extending at least partially over said first gate.

38. The pixel sensor cell of claim 37, wherein the first conductive layer is a layer of doped polysilicon.

39. The pixel sensor cell of claim 37, wherein the first conductive layer is a layer of semitransparent conductive material.

40. The pixel sensor cell of claim 37, wherein the second insulating layer is a layer of silicon oxide.

41. The pixel sensor cell of claim 37, wherein the insulating spacers are spacers selected from the group consisting of silicon oxide spacers, silicon nitride spacers, silicon oxynitride spacers, ON spacers, NO spacers, and ONO spacers.

42. The pixel sensor cell of claim 37, wherein the semitransparent conductive material is doped polysilicon.

43. The pixel sensor cell of claim 37, wherein the semitransparent conductive material is tin oxide.

44. The pixel sensor cell of claim 37, wherein the semitransparent conductive material is indium tin oxide.

45. The pixel sensor cell of claim 37, wherein the imaging device is a CMOS imager.

46. The pixel sensor cell of claim 37, wherein the imaging device is a CCD imager.

47. The pixel sensor cell of claim 37, wherein said second gate further comprises a barrier metal layer on the semitransparent conductive layer.

48. The pixel sensor cell of claim 47, wherein the barrier metal is titanium nitride.

49. The pixel sensor of claim 47, wherein the barrier metal is tungsten nitride.

50. The pixel sensor cell of claim 47, wherein said second gate further comprises a tungsten layer on the barrier metal layer.

51. The pixel sensor cell of claim 37, wherein said second gate further comprises a silicide layer on the semitransparent conductive layer.

52. A pixel sensor cell for use in an imaging device, said pixel sensor cell comprising:

a photosensitive region of a first conductivity type formed in a substrate;

a floating diffusion region of a second conductivity type formed in the substrate and spaced from said photosensitive region;

a first insulating layer formed on the substrate;

a first gate formed on said first insulating layer over said photosensitive region, said first gate comprising a first conductive layer on said first insulating layer, a second insulating layer on the first conductive layer, and insulating spacers formed on the sides of said first gate; and a second gate formed on said second insulating layer, said second gate comprising a semitransparent conductive layer formed on said second insulating layer and extending at least partially over said first gate.

53. The pixel sensor cell of claim 52, wherein the first conductive layer is a layer of doped polysilicon.

54. The pixel sensor cell of claim 52, wherein the first conductive layer is a layer of semitransparent conductive material.

55. The pixel sensor cell of claim 52, wherein the second insulating layer is a layer of silicon oxide.

56. The pixel sensor cell of claim 52, wherein the insulating spacers are spacers selected from the group consisting of silicon oxide spacers, silicon nitride spacers, silicon oxynitride spacers, ON spacers, NO spacers, and ONO spacers.

57. The pixel sensor cell of claim 52, wherein the semitransparent conductive material is doped polysilicon.

58. The pixel sensor cell of claim 52, wherein the semitransparent conductive material is tin oxide.

59. The pixel sensor cell of claim 52, wherein the semitransparent conductive material is indium tin oxide.

60. The pixel sensor cell of claim 52, wherein the imaging device is a CMOS imager.

61. The pixel sensor cell of claim 52, wherein the imaging device is a CCD imager.

62. The pixel sensor cell of claim 52, wherein said second gate further comprises a barrier metal layer on the semitransparent conductive layer.

63. The pixel sensor cell of claim 62, wherein the barrier metal is titanium nitride.

64. The pixel sensor of claim 62, wherein the barrier metal is tungsten nitride.

65. The pixel sensor cell of claim 62, wherein said second gate further comprises a tungsten layer on the barrier metal layer.

66. The pixel sensor cell of claim 52, wherein said second gate further comprises a silicide layer on the semitransparent conductive layer.

* * * * *

UNITED STATES PATENT AND TRADEMARK OFFICE
CERTIFICATE OF CORRECTION

PATENT NO. : 6,376,868 B1
DATED : April 23, 2002
INVENTOR(S) : Howard E. Rhodes

It is certified that error appears in the above-identified patent and that said Letters Patent is hereby corrected as shown below:

Column 2,
Line 64, "GC" should read -- GaAs --.

Column 3,
Line 47, "arc" should read -- are --.

Column 3,
Line 55, "$V_{I,N}$" should read -- $V_{LN}$ --.

Column 4,
Line 61, "to" should read -- $t_o$ --.
Line 65, "$V_{DD}$)" should read -- $V_{DD}$ --.

Column 6,
Line 15, "poly,silicon" should read -- polysilicon --.
Line 33, "silicide" should read -- silicided --.

Column 8,
Line 56, "or is it" should read -- or it --.

Signed and Sealed this

Twenty-fourth Day of September, 2002

Attest:

JAMES E. ROGAN
Attesting Officer        Director of the United States Patent and Trademark Office